(12) United States Patent
Benayon et al.

(10) Patent No.: US 8,788,248 B2
(45) Date of Patent: Jul. 22, 2014

(54) TRANSPARENT FLOW MODEL SIMULATION IMPLEMENTING BI-DIRECTIONAL LINKS

(75) Inventors: Jay William Benayon, Markham (CA); Pablo Daniel Irassar, Markham (CA); Kui Yan Lau, Markham (CA); Humie Leung, Markham (CA); William Gerald O'Farrell, Markham (CA); Vincent Szaloky, Markham (CA)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 12/571,940

(22) Filed: Oct. 1, 2009

(65) Prior Publication Data
US 2011/0022374 A1    Jan. 27, 2011

(30) Foreign Application Priority Data
Jul. 21, 2009    (CA) ..................... 2673556

(51) Int. Cl.
*G06G 7/48*    (2006.01)
*G06F 9/44*    (2006.01)
*G06Q 10/06*    (2012.01)
*G06F 17/50*    (2006.01)

(52) U.S. Cl.
CPC    *G06F 8/34* (2013.01); *G06Q 10/06* (2013.01); *G06Q 10/067* (2013.01); *G06Q 10/0633* (2013.01); *G06F 17/5009* (2013.01)
USPC .......................................................... 703/6

(58) Field of Classification Search
CPC ....................................................... G06F 8/34
USPC .................................................... 703/13, 6
See application file for complete search history.

(56) References Cited

U.S. PATENT DOCUMENTS

| 7,363,600 B1 * | 4/2008 | Ballagh et al. ................ 716/103 |
| 7,437,277 B2 | 10/2008 | Benayon et al. |
| 8,145,468 B2 * | 3/2012 | Fritzsche et al. ................ 703/22 |

OTHER PUBLICATIONS

Milicev, D.; , "Automatic model transformations using extended UML object diagrams in modeling environments," Software Engineering, IEEE Transactions on , vol. 28, No. 4, pp. 413-431, Apr. 2002.*

Karsai, Gábor, et al. "Composition and cloning in modeling and meta-modeling." Control Systems Technology, IEEE Transactions on 12.2 (2004): 263-278.*

(Continued)

*Primary Examiner* — Aniss Chad
(74) *Attorney, Agent, or Firm* — Jordan IP Law, LLC

(57) ABSTRACT

The illustrative embodiments described herein provide a computer implemented method, apparatus, and computer program product for managing a flow model simulation. In an illustrative embodiment, annotated simulation settings are associated with a source model in response to receiving the source model. The annotated simulation settings are derived from at least one of a set of user-defined simulation settings and default simulation settings. The annotated source model is transformed into an internal domain model using a set of links that are generated using a set of link rules. The set of links maps a set of source model elements to a set of internal domain model elements of the internal domain model. Results from a simulation of the internal domain model are mapped back to the source model to identify a context for the results. Thereafter, a target view model is generated from the internal domain model. The target view model includes the results presented in the context of the source model.

25 Claims, 5 Drawing Sheets

(56) References Cited

OTHER PUBLICATIONS

Liew, Philip et al.; A Framework for Business Model Driven Development; Software Technology and Engineering Practice; 2004; pp. 47-56; volume/issue Sep. 17-19; IEEE Computer Society; Washington, DC, USA.

\* cited by examiner

TRANSPARENT FLOW MODEL SIMULATION IMPLEMENTING BI-DIRECTIONAL LINKS

BACKGROUND OF THE INVENTION

1. Field of the Invention

The present invention relates generally to an improved data processing system and in particular to a method and apparatus for a flow model simulation. Still more particularly, the present invention relates to a computer implemented method, apparatus, and computer program product for simulating, animating, and analyzing flow models in an enhanced modeler.

2. Description of the Related Art

A flow model is a model that describes how data is processed and moved throughout a system. In one example, the flow model is a diagrammatic representation of the execution and data flow of a process. A flow model may be a simple, two-dimensional diagram that illustrates the activities that transform data, the manner in which the data is stored, the means by which data is sent and received from the system, and the routes through which the data can pass. Types of flow models may include, for example and without limitation, activity diagrams, flow charts, process flow diagrams, data flow diagrams, UML activity diagrams. Flow models may be generated using any number of currently existing or later developed modeling applications and/or languages, such as, for example and without limitation, unified modeling language (UML), business process execution language (BPEL), business object model (BOM), and Visio.

A flow model includes structural information and semantic information. The structural information of a flow model is information responsible for the presentation of the flow model. In other words, structural information controls the look and feel of the flow model. Structural information may dictate the flow model elements that are present, and how the elements are interconnected. Semantic information of a source model is information relating to the behavior of the elements present in the source model. For example, semantic information may describe the manner in which data of a flow model is manipulated and transformed as it proceeds through elements of the flow model. Incompatibilities between different flow model applications often results in the failure to preserve the structural and semantic information of a source model when simulated in a non-native modeler. Consequently, processing a source model on a non-native modeler often results in a target view model that looks and behaves differently than if the source model were processed on its native modeling application. As used herein, a native modeling application is a modeling application in which a source model is generated.

SUMMARY OF THE INVENTION

The illustrative embodiments described herein provide a computer implemented method, apparatus, and computer program product for managing a flow model simulation. In an illustrative embodiment, annotated simulation settings are associated with a source model in response to receiving the source model. The annotated simulation settings are derived from at least one of a set of user-defined simulation settings and default simulation settings. The annotated source model is transformed into an internal domain model using a set of links that are generated using a set of link rules. The set of links maps a set of source model elements to a set of internal domain model elements of the internal domain model. Results from a simulation of the internal domain model are mapped back to the source model to identify a context for the results. Thereafter, a target view model is generated from the internal domain model. The target view model includes the results presented in the context of the source model.

DETAILED DESCRIPTION OF THE PREFERRED EMBODIMENT

Figure 1:
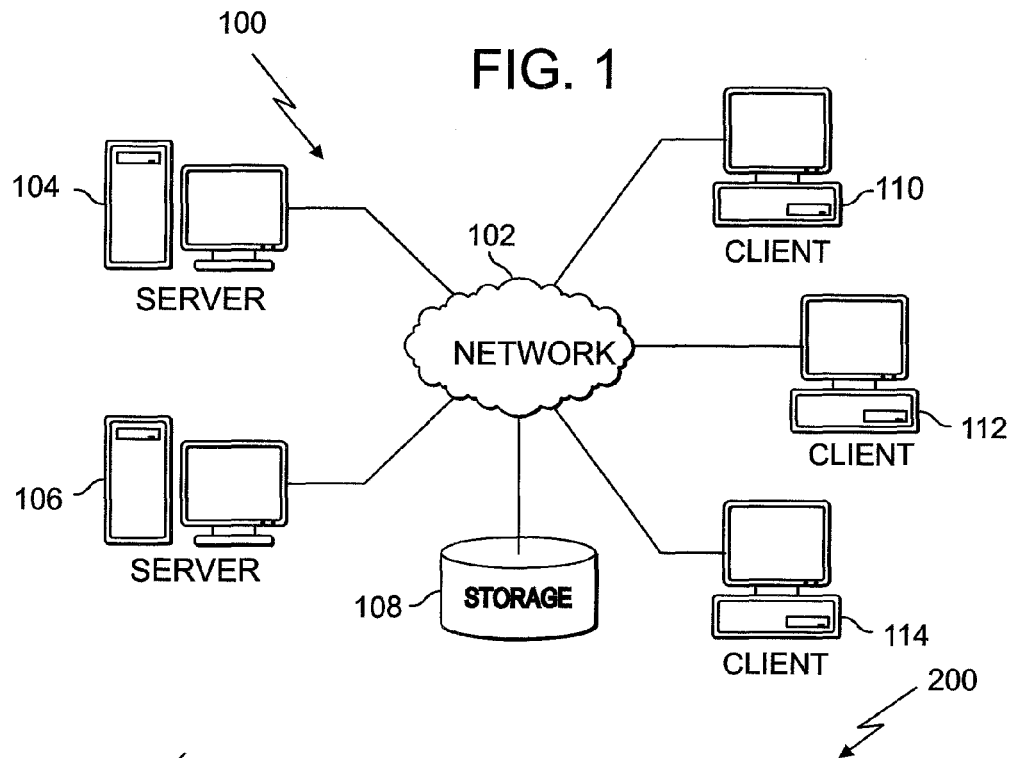
FIG. 1 is a pictorial representation of a network of data processing systems in which illustrative embodiments may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks The term 'computer' when used herein may refer to any such machine or network of machines.

These computer program instructions may also be stored in a computer readable storage medium that can direct a computer, other programmable data processing apparatus, or other devices to function in a particular manner, such that the instructions stored in the computer readable storage medium produce an article of manufacture including instructions which, when executed by a processor on a computer, implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
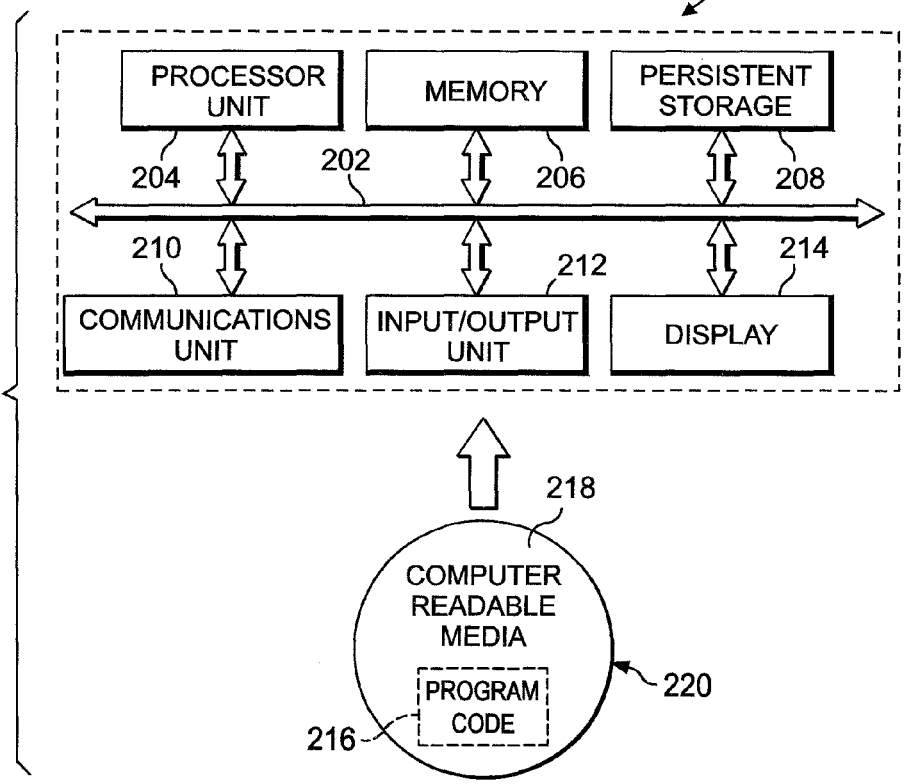
FIG. 2 is a block diagram of a data processing system in which illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In an illustrative example, a computing device, such as client 110 in FIG. 1, may host a first modeling application used to generate a source model. As used herein, a source model is a flow model generated on a modeling application different from the modeling application used for animating and/or simulating the source model. A second computing device, such as client 112 in FIG. 1, may host a second modeling application enhanced in the manner as disclosed herein, and which is capable of simulating, animating, and analyzing the source model generated by the first modeling application. The enhanced modeling application maintains the same look and feel of the source model by preserving the structural and semantic information present in the source model.

Semantic information of the source model is preserved by implementing a simulation annotator. The simulation annotator associates annotated simulation settings with the source model to form an annotated source model. The structural information of the source model is preserved by implementing a link generator that generates a set of links associating elements from the source model with elements from an internal domain model. As used herein, the term "set of" refers to one or more items. Thus, the set of links may include a single link as well as two or more links. A model transformer then transforms the annotated source model into the internal domain model using the set of links A view transformer creates the target view model from the internal domain model. The target view model presents to a user a similar look and feel of the source view model by incorporating into the target view model simulation events, the set of links generated by the link generator, and source view information extracted from the source view model.

Program code located in network data processing system 100 may be stored on a computer recordable storage medium and downloaded to a data processing system or other device for use. For example, program code may be stored on a computer recordable storage medium on server 104 and downloaded to client 110 over network 102 for use on client 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is shown in which illustrative embodiments may be implemented. Data processing system 200 is an example of a computer, such as server 104 or client 110 in FIG. 1, in which computer usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-core processor, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer readable media 218 form computer program product 220 in these examples. In one example, computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer recordable media 218 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples.

In some illustrative embodiments, program code 216 may be downloaded over a network to persistent storage 208 from another device or data processing system for use within data processing system 200. For instance, program code stored in a computer readable storage medium in a server data processing system may be downloaded over a network from the server to data processing system 200. The data processing system providing program code 216 may be a server computer, a client computer, or some other device capable of storing and transmitting program code 216.

The different components illustrated for data processing system 200 are not meant to provide architectural limitations to the manner in which different embodiments may be implemented. The different illustrative embodiments may be implemented in a data processing system including components in addition to, or in place of, those illustrated for data processing system 200. Other components shown in FIG. 2 can be varied from the illustrative examples shown.

As one example, a storage device in data processing system 200 is any hardware apparatus that may store data. Memory 206, persistent storage 208, and computer readable media 218 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

Simulation, animation, and analysis of flow models provide the ability to obtain a deeper understanding of the processes described by behavior of flow diagrams. Flow diagrams can be generated on many flow modeling applications implementing a variety of programming languages, such as Visio, UML, FDL, BPEL, and BOM, among others. Some currently existing modeling applications lack the ability to perform complex simulation and animation functions. In addition, other modeling applications that can perform these functions may only have rudimentary capabilities or may only possess the ability to simulate and animate flow diagrams generated in their own products.

Additional problems arise when flow models generated on one modeling application are animated and/or simulated in a different modeling application. For example, in some instances, analysts may prefer to import flow models generated in one flow modeling application into another that includes more robust modeling tools. However, incompatibilities often alter the look and feel of the original flow model. Therefore, one of the illustrative embodiments disclosed herein provides a method and apparatus for enabling a single modeling tool, such as an enhanced Websphere Business Process Modeler, to simulate, animate, and analyze flow models generated in a different modeling application. Importantly, the method and apparatus disclosed herein preserves the original source view which allows users to animate and simulate flow models while maintaining a similar look and feel and behavior as though the source model were simulated on its native modeling application.

The look and feel of a source flow model is maintained by generating an internal domain model that preserves semantic and structural information by utilizing simulation settings, annotations, and a set of links. Simulation settings are configurable options for animating and simulating a source flow model. Simulation settings may be generated according to predefined rules, or using user-defined simulation settings.

Links are associations between elements of a source model and an internal domain model. The links are generated according to predefined or customizable rules. The set of links enables the preservation of structural information in a source flow model by associating one or more internal domain model elements with one or more source model elements. Examples of model elements present in either the source model or the internal domain model include flow objects, connecting objects, swim lanes, and artifacts. Flow objects may include events, activities, and gateways. Connecting objects may include sequence flows, message flows, and associations. Artifacts may include groups and annotations.

Once generated, the internal domain model may then be sent to a view model generator for transformation into a target view model. In this transformation, view model generator refers to the set of links and source view information derived from the original source view model in order to insure that the look and feel of the source view model is preserved in the newly generated target view model. The target view model is then received by the viewer in order for updating with simulation events.

In accordance with the foregoing, one embodiment of the present invention provides for a computer implemented method, apparatus, and computer program product for managing a flow model simulation. In one illustrative embodiment, a source model is associated with annotated simulation settings that represent semantic characteristics for simulation. The annotated simulation settings may be generated automatically based on a type of the source model and can range from simple configuration options to complex expressions. The generation of these annotations is based on the user-defined and default simulation settings for the source model. The annotated simulation settings are derived from at least one of a set of user-defined simulation settings and default simulation settings. In one embodiment, the annotated simulation settings may be predetermined according to a type of source model. For example, a business process modeling notation (BPMN) source model would have different default simulation settings than a BPEL source model.

The annotated source model is then transformed into an internal domain model using a set of links that are generated using a set of link rules. The set of link rules may include a single link rule, as well as two or more link rules. The set of links maps or otherwise associates a set of source model elements with a set of internal domain model elements of the internal domain model. In one embodiment, the set of links are added to the internal domain model to synchronize the source view model with the target view model, which is generated from the internal domain model. Each link associates one or more source model elements with one or more internal domain model elements, thus establishing the structural connections between the source model and internal domain model. Results from a simulation of the internal domain model are mapped back to the source model to identify a context for the results. Thereafter, a target view model is generated from the internal domain model. The target view model includes the results from the simulation presented in the context of the source model.

As used herein, the term "look and feel" refers to the design and behavior of elements associated with a user interface, such as a graphical user interface (GUI). Look and feel refers to design elements, such as color, shapes, textures, icon appearance, icon size, font sizes, layout, typefaces, and the design and appearance of other visual elements. Look and feel also refers to the behavior and/or interaction of flow model elements, such as a set of source model elements or a set of internal domain model elements.

Figure 3:
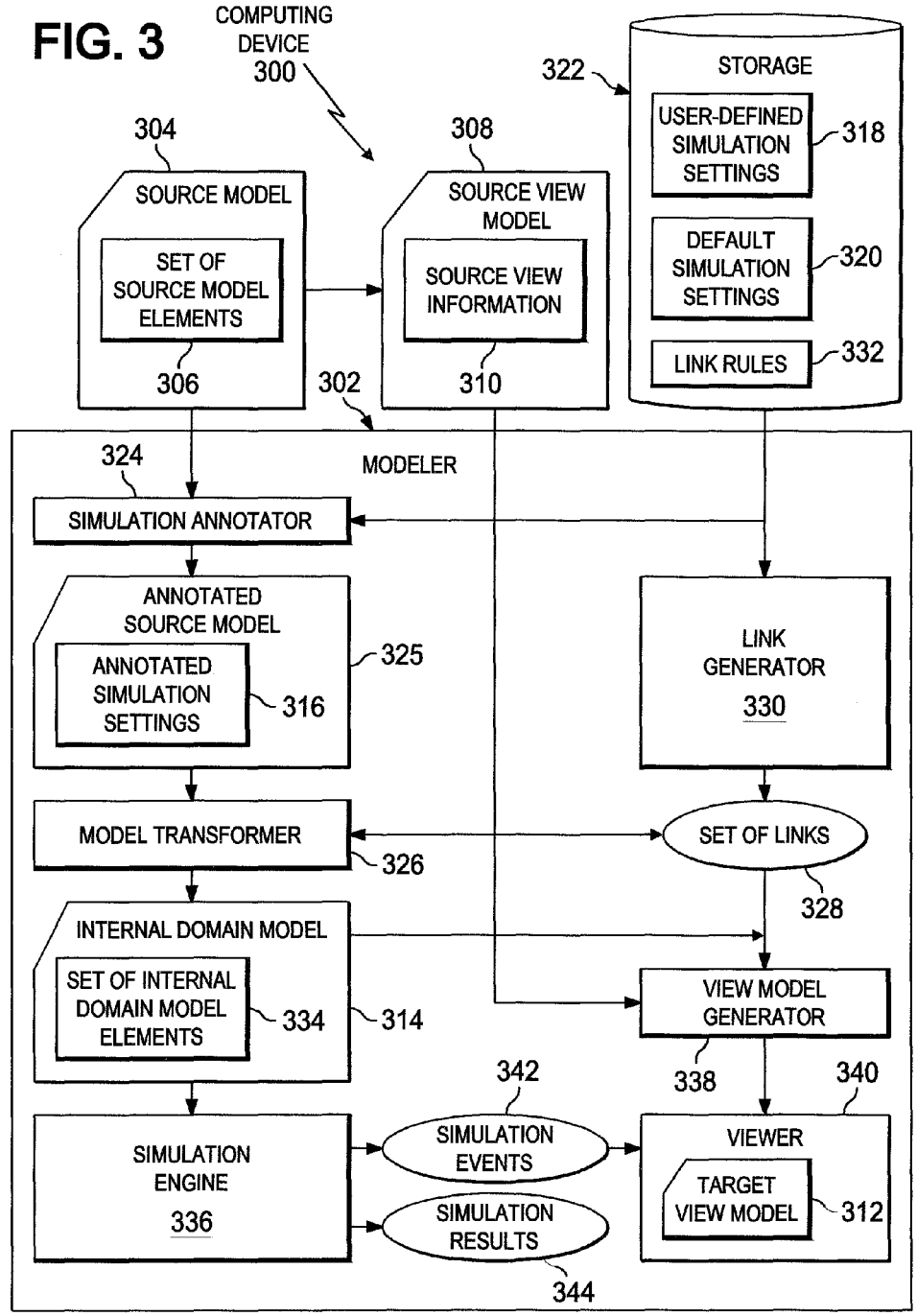
FIG. 3 is a block diagram of a data processing system for managing a flow model simulation in accordance with an illustrative embodiment.

FIG. 3 is a block diagram of a computing device configured for managing a flow model simulation in accordance with an illustrative embodiment. Computing device 300 is a computing device such as client 110 in FIG. 1. In this illustrative example, computing device 300 hosts modeler 302 for managing a flow model simulation. Modeler 302 may be any currently existing or later developed modeling application. In this illustrative example in FIG. 3, modeler 302 is an enhanced Websphere Business Process Modeler offered by IBM Corporation.

Modeler 302 is a software application for generating, simulating, animating, and analyzing flow models. Modeler 302 is configured to process flow models, including but without limitation, source model 304. Source model 304 is a flow model generated by a modeling application other than modeler 302. For example, if modeler 302 is the Websphere Business Process Modeler, then source model 304 may be a flow model generated by Visio, a software program offered by Microsoft Corporation.

Source model 304 includes set of source model elements 306. A model element in set of source model elements 306 is an abstraction of a structural or behavioral feature of the system that is being modeled. Set of source model elements 306 is one or more model elements incorporated in source model 304. Model elements are often depicted in flow models using predefined shapes. Examples of types of model elements include, flow objects, connecting objects, swim lanes, and artifacts.

A native modeling application (not shown) may process source model 304 to generate source view model 308. The processing of source model 304 may be, for example but without limitation, the simulation of source model 304 with specified inputs or parameters. Source view model 308 is a simulated flow model based on source model 304 and containing only the objects, relationships, parameters, and constraints present in the system or flow diagram that are relevant to the simulation. Source view model 308 includes source view information 310. Source view information 310 is the visual information that may be included in source view model 308. Examples of source view information 310 include, without limitation, the type and quantity of shapes used in source view model 308 and the connections between those shapes.

Modeler 302 is configured to preserve the look and feel and behavior of source view model 308 in target view model 312. Target view model 312 is the simulated flow model that is generated when source model 304 is processed by modeler 302. One step in processing source model 304 in modeler 302 is the transformation of source model 304 into internal domain model 314. Internal domain model 314 is a business object model that describes all business objects, attributes, and relationships of a process represented by source model 304. Internal domain model 314 provides the benefit of reducing the complexity of generating multiple simulations of source model 304. For example, if the inputs feeding source model 304 change, then rather than having to restart the simulation every time by first investing resources to transform source model 304 into an compatible model, modeler 302 can quickly and simply simulate internal domain model 314 with the new inputs.

The simulation of internal domain model 314 is governed by annotated simulation settings 316. Annotated simulation settings 316 are rules by which internal domain model 314 is simulated Annotated simulation settings 316 enable a simulation engine to simulate source model 304 in the manner consistent with the simulation of source model 304 in its native modeler. Annotated simulation settings 316 are derived from at least one of user-defined simulation settings 318 and default simulation settings.

As used herein, the term "at least one of", when used with a list of items means that different combinations of one or more of the items may be used and only one of each item in the list may be needed. For example, "at least one of item A, item B, and item C" may include, for example, without limitation, item A or item A and item B. This example also may include item A, item B, and item C or item B and item C. Thus, annotated simulation settings 316 may include simulation settings derived from user-defined simulation settings 318, or default simulation settings 320, or both.

Default simulation settings 320 are simulation settings that may be defined by modeler 302. In one embodiment, default simulation settings 320 are predefined simulation settings provided by a simulation engine. Default simulation settings 320 dictate the simulation and animation of internal domain model 314 in the absence of user-defined simulation settings 318. User-defined simulation settings 318 are simulation settings provided by a user which are specific to source model 304. In addition, a combination of simulation settings from user-defined simulation settings 318 and default simulation settings 320 may be applied. For example, a user may elect to simulate source model 304 using default simulation settings 320, and may also provide additional settings in user-defined simulation settings 318.

Non-limiting examples of simulation settings that may be controlled by annotated simulation settings 316 involve the handling of idle time during processing, the length of time internal domain model 314 is processed, or which cost values are processed, the manner in which the cost values are processed, and how the cost values are distributed. Annotated simulation settings 316 may control any type of animation or simulation of internal domain model 314.

In this illustrative example in FIG. 3, user-defined simulation settings 318 and default simulation settings 320 are maintained in storage 322. Storage 322 is a data storage device such as storage device 108 in FIG. 1. In addition, storage 322 may be implemented as, without limitation, a portable computer diskette, a hard disk, a random access memory (RAM), a read-only memory (ROM), an erasable programmable read-only memory (EPROM or Flash memory), a portable compact disc read-only memory (CDROM), or an optical storage device.

Simulation annotator 324 is a software component configured for associating annotated simulation settings 316 with source model 304. The association of simulation settings with source model 304 forms annotated source model 325. Annotated source model 325 is a source model, such as source model 304, with which simulations settings have been associated. Although annotated simulation settings 316 are depicted as incorporated in annotated source model 325, in an alternate embodiment, the annotated simulation settings 316 may be stored elsewhere in various formats, such as in storage 322 as a simulation profile. An example of annotated simulation settings 316 is provided in FIG. 5.

Model transformer 326 is a software component for transforming annotated source model 325 into internal domain model 314. Model transformer 326 uses set of links 328 for generating internal domain model 314. Set of links 328 is one or more links for mapping elements and/or results from the simulation of those elements from set of source model elements 306 with elements of internal domain model 314. Set of links 328 are generated by link generator 330. Link generator 330 is a software component for generating set of links 328 according to link rules 332. Link rules 332 are instructions that govern the creation of set of links 328. Link rules 332 may be, but are not limited to, default instructions packaged with modeler 302. In another embodiment, link rules 332 are customizable for each type of source model processed by modeler 302 or each type of modeler from which source model 304 is received. Thus, link rules 332 may be default link rules, user defined, customized link rules, or any combination of default rules and customized rules.

Model transformer 326 uses set of links 328 to create internal domain model 314. In one embodiment, model transformer 326 uses the data stored in set of links 328 to generate set of internal domain model elements 334. Initially, when set of links 328 is generated by link generator 330, a pointer is stored in set of links 328 for each element in set of source model elements 306. The existence of pointers in set of links 328 enables model transformer 326 to identify the elements presently in set of source model elements 306. Consequently, model transformer 326 may use this information to determine which elements to include in set of internal domain model elements 334 when generating internal domain model 314.

Either before or after the generation of internal domain model 314, metadata included in set of links 328 is updated. The metadata helps to preserve the semantics of source model 304 in target view model 312. For example, both source model 304 and target view model 312 may support expressions. However, some expressions in target view model 312 may be mapped directly from user-specified expressions in the source model, such as on decision nodes. Other expressions may be generated in target view model 312 to simulate a feature present in source model 304, but absent in target view model 312, such as sort criteria on input queues. The metadata may be updated to identify which expressions are mapped and which expressions are generated. The metadata facilitates the handling of incompatibilities and inconsistencies between source model 304 and target view model 312.

In addition to updating metadata, set of links 328 is updated to include pointers for elements in set of internal domain model elements 334. The inclusion of the pointers in set of links 328 for set of internal domain model elements 334 forms bidirectional links for mapping elements from set of source model elements 306 to elements from set of internal domain model elements 334. This association enables a simulation engine, such as simulation engine 336 to simulate internal domain model 314 but present the results in the context of the original process as represented in source model 304.

Simulation engine 336 is a software component for simulating internal domain model 314. In this illustrative embodiment, simulation engine 336 is included in modeler 302. However, in alternate embodiments, simulation engine 336 may be a stand-alone software component capable of processing internal domain model 314. In either scenario, simulation engine 336 processes internal domain model 314 according to annotated simulation settings 316 and with reference to set of links 328. Simulation engine 336 references set of links 328 during simulation for updating animation and running statistics, and after simulation to generate graphs, reports, and other post-simulation processing.

Links from set of links 328 enable simulation engine 336 to identify a context for results generated by a simulation of internal domain model 314. Restated, set of links 328 enables simulation engine 336 to dynamically map simulation results back to source model 304 to identify the one or more elements from set of source model elements 306 that are associated with the results. In this manner, set of links 328 enables simulation engine to associate separate but related tasks during simulation. For example, if more than one element in set of internal domain model elements 334 is required to calculate an aggregate cost, then set of links 328 connects the related tasks so that simulation engine 336 is aware that the more than one task are related and pertinent to the cost calculation. In addition, set of links 328 associates these related tasks with the corresponding element or elements from set of source model elements 306 relating to the aggregate cost. Identifying a context for simulation results enables simulation engine 336 to determine how to present the results in a target view model or how to further process the results before presentation. The association of elements from set of source model elements 306 and elements from set of internal domain model elements 334 is discussed in more detail in FIG. 6.

In addition to being processed by simulation engine 336, internal domain model 314 is also processed by view model generator 338. View model generator 338 is a software component of modeler 302 that transforms internal domain model 314 into target view model 312. The transformation of internal domain model 314 to target view model 312 includes steps for conforming target view model 312 to source view model 308. In particular, view model generator 338 extracts source view information 310 from source view model 308 and incorporates that information into target view model 312.

View model generator 338 refers to set of links 328 to determine which elements from set of internal domain model elements 334 to include in target view model 312. In a non-limiting example, metadata from set of links 328 may indicate that a particular element from set of internal domain model elements 334 was generated solely to simulate a feature present in source model 304 but that the element should not be displayed in target view model 312. View model generator 338 would then hide that element so that the element would not be displayed in target view model 312.

Once generated, target view model 312 is sent to viewer 340. Viewer 340 is a software component of modeler 302 for presenting target view model 312. Viewer 340 receives simulation events 342 from simulation engine 336 and updates target view model 312 with simulation events 342. Simulation events 342 are one or more events generated during the simulation of internal domain model 314 by simulation engine 336. Examples of events may include, for example but without limitation, key presses, mouse movement, action selections, timer expirations, or the availability of new data for reading a file or network stream. Simulation events 342 may be detected by event listeners (not shown) and then passed on to viewer 340 for use in updating target view model 312. Simulation events 342 may specify the type of event, when the events occurred, what caused the event to occur, and data of how the event should be processed or included in target view model 312.

During the processing of internal domain model 314, simulation engine 336 may also generate simulation results 344. Simulation results 344 is data derived from the processing of internal domain model 314 that may be used for analysis of the process represented by source model 304. In one embodiment, simulation results 344 may be used to generate graphs and tables for presentation on viewer 340.

Figure 4:
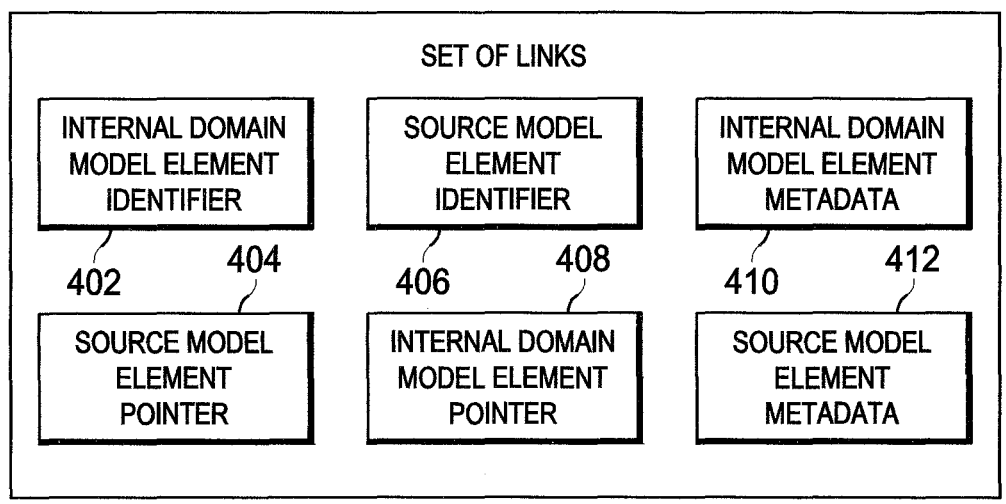
FIG. 4 is a block diagram of a set of links for managing a flow model simulation in accordance with an illustrative embodiment.

FIG. 4 is a block diagram of a set of links for managing a flow model simulation in accordance with an illustrative embodiment. Set of links 400 is a set of links such as set of links 328 in FIG. 3.

Set of links 400 includes information that associates a set of source model elements with a set of internal domain model elements. The association of source model elements with internal domain model elements enables the preservation of the structural elements of the source model. Set of links 400 are generated by a link generator, such as link generator 330 in FIG. 3.

In this illustrative embodiment in FIG. 4, set of links 400 is depicted as a table populated with data generated by a link generator. Set of links 400 are bidirectional links that map or otherwise associate internal domain model elements with source model elements. Set of links 400 may include pointers that enable a software component, such as simulation engine 336 in FIG. 3, to negotiate back and forth between the source model and the internal domain model as needed. For example, for a simulation engine to simulate a process represented by an internal domain model and still be able to present the results in the context of the process as represented by the source model, the simulation engine would use the set of links to translate the simulation results from the internal domain model simulation context to the source model context. These negotiations between the internal domain model and the source model are performed during simulation and after simulation.

Set of links 400 may include internal domain model element identifier 402. Internal domain model element identifier 402 is a list of one or more unique identifiers for identifying an internal domain model element in an internal domain model. Set of links 400 also includes source model element pointer 404. Source model element pointer 404 is a list of one or more addresses or other form of pointers for identifying source model elements. This pairing of internal domain model element identifier 402 and source model element pointer 404 is the link that identifies a source model element that corresponds with the identified internal domain model element. Similarly, set of links 400 includes another link that identifies an internal domain model element that corresponds to a source model element. This second link is formed by pairing source model element identifier 406 with internal domain model element pointer 408. Source model element identifier 406 is a list of one or more unique identifiers for identifying a source model element in a source model. Internal domain model element pointer 408 is a list of one or more addresses or other form of pointers for identifying an internal domain model element.

Complications may arise due to incompatibilities between source model elements and internal domain model elements. These complications are remediated by internal domain model element metadata 410 and source model element metadata 412. Source model element metadata 412 and internal domain model element metadata 410 are metadata describing source model elements and internal domain model elements, respectively. For example, both the source model and the internal domain model may support expressions. However, some expressions in the internal domain model may be mapped directly from user-specified expressions from the source model, whereas other expressions may be generated to simulate a feature present in the source model but not present in the internal domain model, such as a sort criteria on an input queue. The metadata represented by internal domain model element metadata 410 and source model element metadata 412 may be used to flag which model elements are mapped and which model elements are generated.

The data types shown in FIG. 4 are non-limiting examples of data types that may be optionally used. In other embodiments, additional data types not described in FIG. 4 may be implemented in addition to the data types shown. Likewise, other embodiments may be implemented using fewer data types than those described in FIG. 4.

Figure 5:
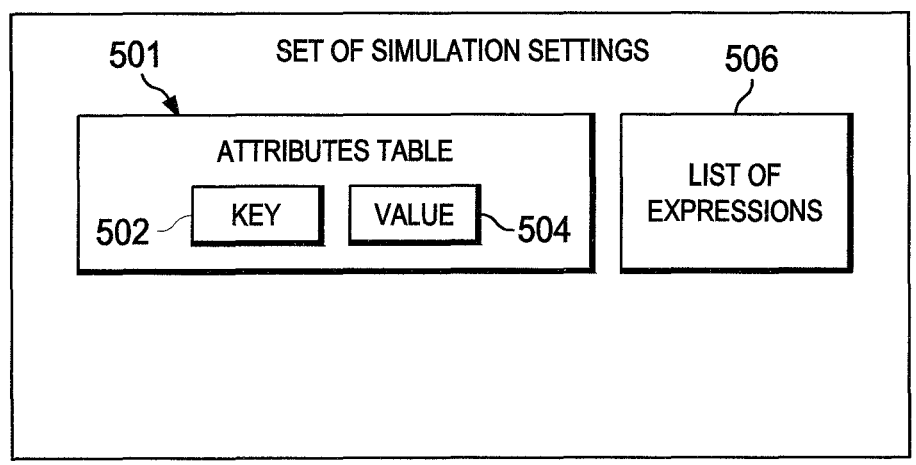
FIG. 5 is a block diagram of a set of simulation settings for managing a flow model simulation in accordance with an illustrative embodiment.

FIG. 5 is a block diagram of set of simulation settings for managing a flow model simulation of a source model in accordance with an illustrative embodiment. Set of simulation settings 500 is a set of simulations settings such as annotated simulation settings 316 in FIG. 3.

In this illustrative embodiment in FIG. 5, set of simulation settings 500 is depicted as a table populated with a set of configurable fields to store simulation settings for use with animating and simulating an internal domain model. Set of simulation settings 500 is a data structure including attribute table 501. Attribute table 501 is a data structure that associates a key with one or more values. For example, key 502 is a data type that may correlate with or be used to identify an element in a set of source model elements. Value 504 is data assigned to a particular key. Value 504 may be evaluated according to one or more expressions present in list of expressions 506. List of expressions 506 is one or more rules for evaluating value 504. In particular, list of expressions 506 may be a combination of values, variables, operators, and functions that are used for computing and returning another value. List of expressions 506 may be predefined by a modeling application or may be provided by a user for controlling the simulation of an internal domain model formed from a source model.

One non-limiting example illustrating the implementation of set of simulation settings 500 involves cost calculations. For example, set of simulation settings 500 may include two keys, cost 1 and cost 2. In addition, each of the two keys may be associated with unique cost values. Each cost value may be assigned a particular expression for evaluating the associated cost value. Set of simulation settings 500 may then be used by a simulation engine during the simulation and animation phase to calculate one or more costs using the values assigned to cost 1 and cost 2.

In other embodiments, set of simulation settings 500 may be any form of data structure, such as a hash table or associative array. In addition, the fields shown in FIG. 5 are non-limiting examples of fields that may be optionally used. In other embodiments, additional fields not described in FIG. 5 may be implemented in addition to the fields shown. Likewise, other embodiments may be implemented using fewer fields than those described in FIG. 5.

Figure 6:
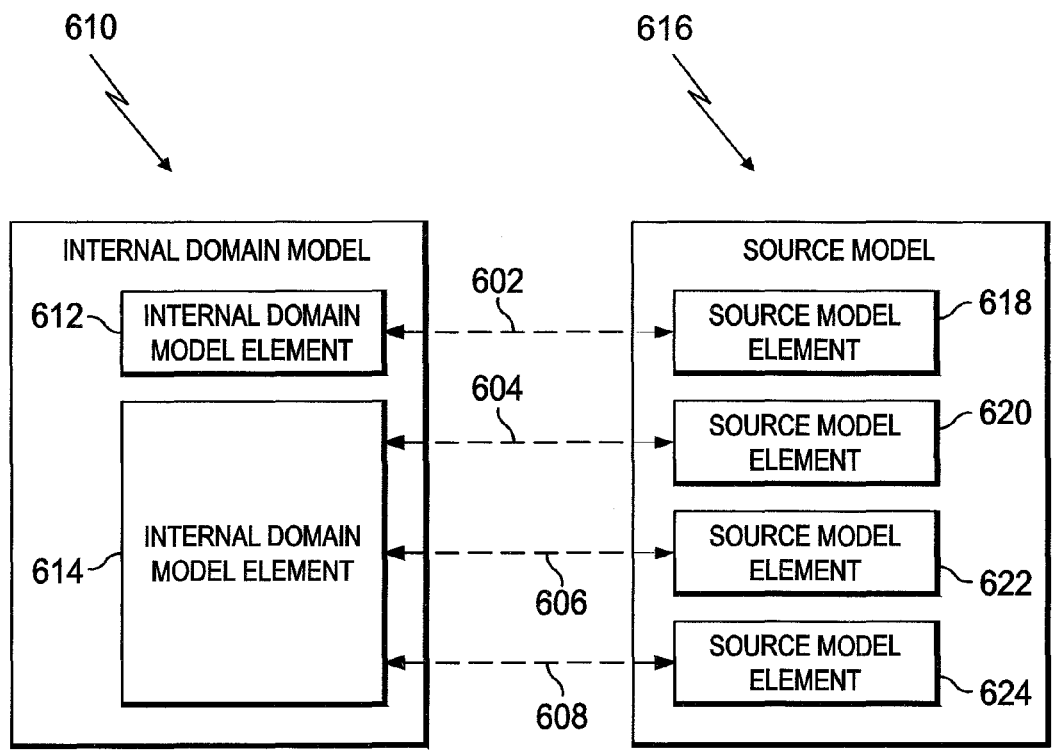
FIG. 6 is a block diagram illustrating the association of source model elements and internal domain model elements in accordance with an illustrative embodiment.

FIG. 6 is a block diagram illustrating the association of source model elements and internal domain model elements in accordance with an illustrative embodiment. The associations are defined by a set of links such as set of links 328 in FIG. 3. The set of links in FIG. 6 include links 602, 604, 606, and 608.

Internal domain model 610 is an internal domain model, such as internal domain model 314 in FIG. 3. Internal domain model 610 includes internal domain model elements 612 and 614. Internal domain model elements 612 and 614 form a set of internal domain model elements, such as set of internal domain model elements 334 in FIG. 3. Similarly, source model 616 is a source model such as source model 304 in FIG. 3. Source model 616 includes source model elements 618, 620, 622, and 624. Source model elements 618, 620, 622, and 624 form a set of source model elements such as set of source model elements 306 in FIG. 3.

In an illustrative embodiment, each link in a set of links associates elements in a source model with one or more related elements in an internal domain model. Elements associated by links can be on a one-to-one basis, a one-to-many basis, or a many-to-one basis. For example, when a model transformer maps source model element 618 using link rules, such as link rules 322 in FIG. 3, the model transformer generates only internal domain model element 612. Thus, the link associating internal domain model element 612 and source model element 616 associates elements on a one-to-one basis.

Link rules may also instruct a model transformer to map elements of internal domain model 610 and source model 616 on a one-to-many basis or a many-to-one basis. In FIG. 6, links 604, 606, and 608 associate source model elements, source model elements 620, 622, and 624, with a single internal domain model element, internal domain model element 614. As indicated above, this one-to-many relationship is mapped in accordance with link rules.

The set of links allows a simulation engine to traverse between source model 616 and internal domain model 610 during the animation and simulation of source model 616 in an enhanced modeler, such as modeler 302 in FIG. 3.

Figure 7:
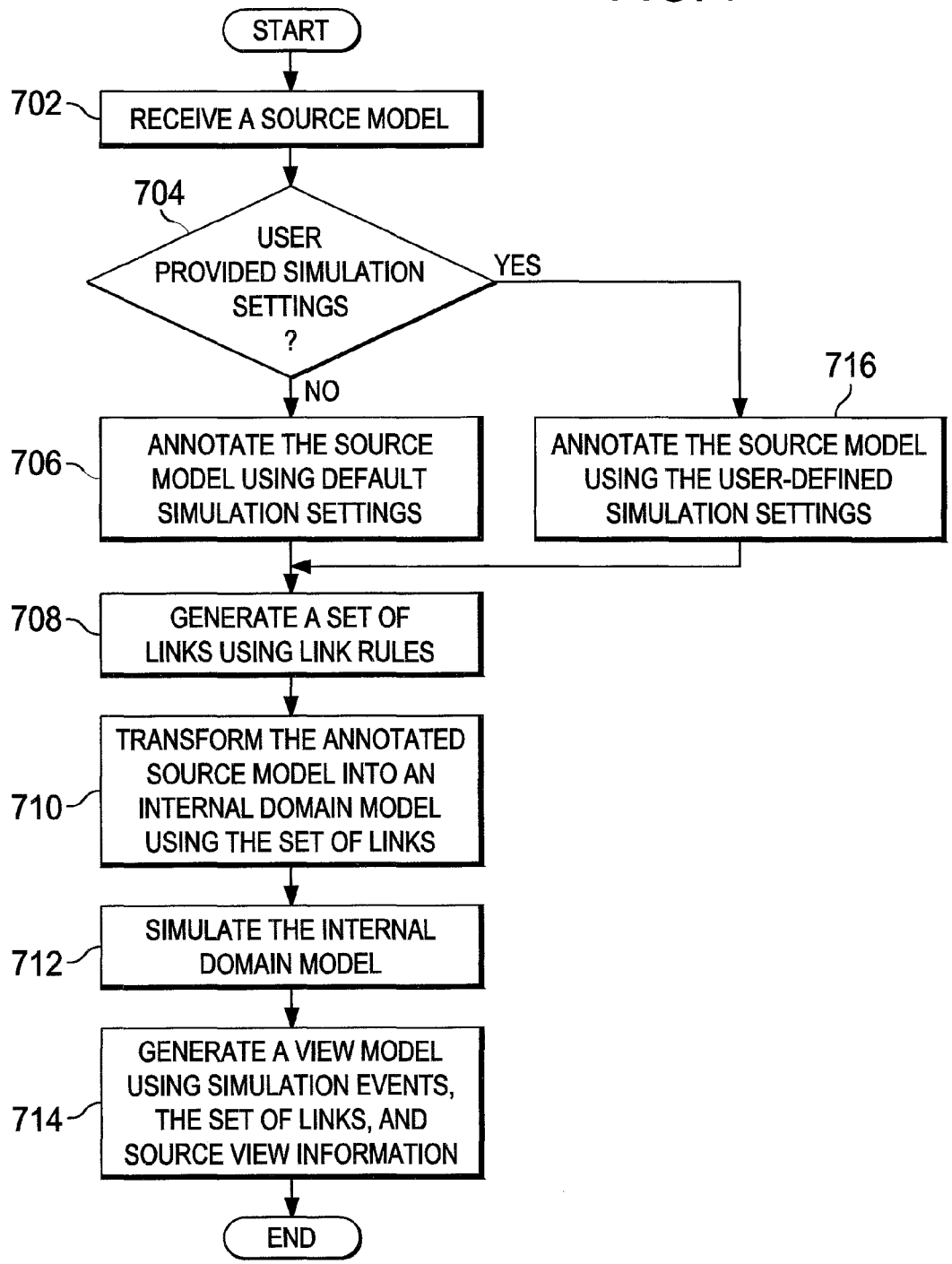
FIG. 7 is a flowchart of a process for managing a flow model simulation in accordance with an illustrative embodiment.

FIG. 7 is a flowchart of a process for managing a flow model simulation in accordance with an illustrative embodiment. The process may be implemented in a modeler, such as modeler 302 in FIG. 3.

The process begins by receiving a source model (step 702). The source model is a source model such as source model 304 in FIG. 3. The source model may be received from any currently existing or later developed flow model application. A determination is made as to whether user-provided simulation settings exist (step 704). If user-provided simulation settings do not exist, then the source model is annotated with default simulation settings (step 706).

A set of links are generated using a set of link rules (step 708). The set of links associate internal domain model elements with source model elements, as depicted in FIG. 6. The annotated source model is then transformed into an internal domain model using the set of links (step 710). The internal domain model is then simulated (step 712). Finally, a view model is generated using simulation events, the set of links, and source view information (step 714) and the process terminates.

Returning to step 704, if a determination is made that user-provided simulation settings are provided, then the source model is annotated with the user-provided simulation settings (step 716). The process then implements steps 708-714 and terminates thereafter.

Thus, the illustrative embodiments described herein provide a computer implemented method, apparatus, and computer program product for managing a flow model simulation. In an illustrative embodiment, annotated simulation settings are associated with a source model in response to receiving the source model. The annotated simulation settings are derived from at least one of a set of user-defined simulation settings and default simulation settings. The annotated source model is transformed into an internal domain model using a set of links that are generated using a set of link rules. The set of links maps a set of source model elements to a set of internal domain model elements of the internal domain model. Results from a simulation of the internal domain model are mapped back to the source model to identify a context for the results. Thereafter, a target view model is generated from the internal domain model. The target view model includes the results presented in the context of the source model.

The method and apparatus disclosed herein enables the simulation of a source model on a modeling application different than the one used to generate the source model. One benefit of simulating the source model on a non-native modeling application is the availability of more advanced modeling and simulation tools. Incompatibilities that may arise from the differences in which different modeling applications process flow models are remediated by the implementation of annotations, simulation settings, and bidirectional links. In addition, the target flow model preserves the look and feel and behavior of the source model by preserving the semantic and structural information present in the source flow model. Thus, the target flow model is familiar to users and facilitates recognition and analysis. Additionally, the animation, simulation, and analysis of the source flow model in an enhanced modeling application, such as the modeling application disclosed herein, a user may perform more robust processing of the source model.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or to limit the invention to the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable storage medium providing program code for use by or in connection with a computer or any instruction execution system. For the purposes of this description, a computer-usable or computer readable storage medium can be any tangible apparatus that can contain, store, communicate, or transport the program for use by or in connection with the instruction execution system, apparatus, or device.

The storage medium can be an electronic, magnetic, optical, electromagnetic, infrared, or semiconductor system (or apparatus or device). Examples of a computer-readable storage medium include a semiconductor or solid-state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements may include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for managing a flow model simulation, the computer implemented method comprising:

responsive to receiving a source model created in a non-native modeler, associating annotated simulation settings with the source model to form an annotated source model, wherein the annotated simulation settings are derived from at least one of a set of user-defined simulation settings and default simulation settings;

transforming the annotated source model into an internal domain model using a set of links, wherein the set of links are generated using a set of link rules that comprise instructions that govern the creation of the set of links, the set of link rules customizable for the source model, and wherein the set of links maps a set of source model elements to a set of internal domain model elements of the internal domain model;

mapping results from a simulation of the internal domain model back to the source model to identify a context for the results, wherein the simulation is governed by the annotated simulation settings; and generating a target view model from the internal domain model, wherein the target view model comprises the results presented in the context of the source model.

2. The computer implemented method of claim 1, wherein identifying a context for the results comprises:

identifying, using the set of links, one or more elements from the set of source model elements corresponding to the results.

3. The computer implemented method of claim 1, further comprising:

capturing simulation events from a simulation of the internal domain model; and updating the target view model with the simulation events.

4. The computer implemented method of claim 1, wherein transforming the annotated source model into the internal domain model further comprises:

generating a set of internal domain elements corresponding to the set of source model elements; and updating metadata fields in the set of links for the set of internal domain elements and the set of source model elements.

5. The computer implemented method of claim 1, wherein generating the target view model further comprises:

conforming the target view model to the source view model.

6. The computer implemented method of claim 5, wherein conforming the target view model further comprises at least one of hiding objects absent from the source model and abstracting target view objects with source view objects.

7. The computer implemented method of claim 1, wherein the set of links comprise one or more bidirectional links.

8. The computer implemented method of claim 1, wherein the set of links comprise one or more pointers corresponding to one or more elements in the set of source model elements and one or more pointers corresponding to one or more elements in the set of internal domain model elements.

9. The computer implemented method of claim 1, wherein the set of links comprise a pairing between an internal domain model element identifier and a domain model element pointer.

10. A computer program product for managing a flow model simulation, the computer program product comprising:

a computer readable storage device;

program instructions for associating annotated simulation settings with a source model to form an annotated source model in response to receiving the source model created in a non-native modeler, wherein the annotated simulation settings are derived from at least one of a set of user-defined simulation settings and default simulation settings;

program instructions for transforming the annotated source model into an internal domain model using a set of links, wherein the set of links are generated using a set of link rules that comprise instruction that govern the creation of the set of links, the set of link rules customizable for the source model, and wherein the set of links maps a set of source model elements to a set of internal domain model elements of the internal domain model;

program instructions for mapping results from a simulation of the internal domain model back to the source model to identify a context for the results, wherein the simulation is governed by the annotated simulation settings;

program instructions for generating a target view model from the internal domain model, wherein the target view model comprises the results presented in the context of the source model; and wherein the program instructions are stored on the computer-readable storage device.

11. The computer program product of claim 10, wherein the result mapping program instructions further comprises instructions for identifying, using the set of links, one or more elements from the set of source model elements corresponding to the results.

12. The computer program product of claim 10, further comprising:

program instructions for capturing simulation events from a simulation of the internal domain model; and program instructions for updating the target view model with the simulation events.

13. The computer program product of claim 10, wherein the program instructions for transforming the annotated source model into the internal domain model further comprises:

instructions for generating a set of internal domain elements corresponding to the set of source model elements; and instructions for updating metadata fields in the set of links for the set of internal domain elements and the set of source model elements.

14. The computer program product of claim 10, wherein the program instructions for generating the view model further comprise:

instructions for conforming the target view model to the source view model.

15. The computer program product of claim 14, wherein the instructions for conforming the target view model further comprise at least one of hiding objects absent from the source model and abstracting view objects with source view objects.

16. A system for managing a flow model simulation, the system comprising:

a processor;

a memory operably connected to the processor;

a link generator, wherein the link generator generates a set of links using link rules that comprise instruction that govern the creation of the set of links, the set of link rules customizable for the source model, wherein the links map a set of source model elements to a set of internal domain model elements;

a simulation annotator logic module, wherein the simulation annotator associates annotated simulation settings with a source model to form an annotated source model, wherein the annotated simulation settings are derived from at least one of a set of default simulation settings and a set of user-defined simulation settings;

a model transformer logic module, wherein the model transformer transforms the annotated source model into an internal domain model using the set of links; and a view model generator logic module, wherein the view model generator generates a target view model from the internal domain model;

wherein the link generator, the simulation annotator, the model transformer, and the view model generator comprise program instructions stored on the memory and executed by the processor.

17. The system of claim 16, further comprising:

a viewer comprising program instructions stored on the memory and executed by the processor, wherein the viewer updates the target view model with simulation events and wherein the target view model presents the target view model for viewing.

18. The system of claim 16, further comprising:

a simulation engine comprising program instructions stored on the memory and executed by the processor, wherein the simulation engine maps results from a simulation of the internal domain model back to the source model to identify a context for the results, wherein the simulation is governed by the annotated simulation settings.

19. The system of claim 18, wherein the simulation engine generates simulation events for updating the target view model.

20. An apparatus for managing a batch production system, the apparatus comprising:

a bus system;

a memory connected to the bus system, wherein the memory includes computer usable program code; and a processing unit connected to the bus system, wherein the processing unit executes the computer usable program code to: associate annotated simulation settings with a source model created in a non-native modeler to form an annotated source model in response to receiving the source model, wherein the annotated simulation settings are derived from at least one of a set of user-defined simulation settings and default simulation settings; transform the annotated source model into an internal domain model using a set of links, wherein the set of links are generated using a set of link rules that comprise instruction that govern the creation of the set of links, the set of link rules customizable for the source model, wherein the set of links maps a set of source model elements to a set of internal domain model elements of the internal domain model; map results from a simulation of the internal domain model back to the source model to identify a context for the results, wherein the simulation is governed by the annotated simulation settings; and generate a target view model from the internal domain model, wherein the target view model comprises the results presented in the context of the source model.

21. The apparatus of claim 20, wherein the processing unit further executes the computer usable program code to identify, using the set of links, one or more elements from the set of source model elements corresponding to the results.

22. The apparatus of claim 20, wherein the processing unit further executes the computer usable program code to capture simulation events from a simulation of the internal domain model; and update the target view model with the simulation events.

23. The apparatus of claim 20, wherein the processing unit further executes the computer usable program code for transforming the annotated source model into the internal domain model to generate a set of internal domain elements corresponding to the set of source model elements; and update meta data fields in the set of links for the set of internal domain elements and the set of source model elements.

24. The apparatus of claim 20, wherein the processing unit further executes the computer usable program code for conforming the target view model to the source view model.

25. The apparatus of claim 24, wherein the processing unit further executes the computer usable program code to perform at least one of: hide objects absent from the source model and abstract view objects with source view objects.

* * * * *